United States Patent
Lin et al.

(10) Patent No.: US 10,772,210 B2
(45) Date of Patent: Sep. 8, 2020

(54) SOLUTION PROPERTY SENSOR

(71) Applicant: National Sun Yat-sen University, Kaohsiung (TW)

(72) Inventors: Che-hsin Lin, Kaohsiung (TW); Wei-hsing Yen, Kaohsiung (TW); Wei-sin Kao, Kaohsiung (TW)

(73) Assignee: National Sun Yat-sen University, Kaohsiung (TW)

(*) Notice: Subject to any disclaimer, the term of this patent is extended or adjusted under 35 U.S.C. 154(b) by 75 days.

(21) Appl. No.: 16/153,771

(22) Filed: Oct. 7, 2018

(65) Prior Publication Data
US 2020/0113060 A1    Apr. 9, 2020

(51) Int. Cl.
| | |
|---|---|
| *G01N 27/416* | (2006.01) |
| *H05K 1/18* | (2006.01) |
| *H05K 3/30* | (2006.01) |
| *G01K 7/16* | (2006.01) |
| *H05K 1/02* | (2006.01) |
| *G01N 27/10* | (2006.01) |

(52) U.S. Cl.
CPC .......... *H05K 1/189* (2013.01); *G01K 7/16* (2013.01); *G01N 27/10* (2013.01); *G01N 27/4167* (2013.01); *H05K 1/0296* (2013.01); *H05K 1/182* (2013.01); *H05K 3/305* (2013.01); *H05K 2201/05* (2013.01); *H05K 2201/095* (2013.01); *H05K 2201/10151* (2013.01)

(58) Field of Classification Search
CPC ...... G01N 27/27; G01N 27/30; G01N 27/301; G01N 27/302; G01N 33/18
See application file for complete search history.

(56) References Cited

U.S. PATENT DOCUMENTS

| | | | | |
|---|---|---|---|---|
| 5,336,388 A | * | 8/1994 | Leader | G01N 27/403 204/403.06 |
| 5,342,498 A | * | 8/1994 | Graves | G01N 27/403 204/403.06 |
| 5,431,806 A | * | 7/1995 | Suzuki | G01N 27/404 204/403.06 |

(Continued)

FOREIGN PATENT DOCUMENTS

| | | |
|---|---|---|
| CN | 102495119 A | 6/2012 |
| JP | 2004517336 A | 6/2004 |

(Continued)

OTHER PUBLICATIONS

Kao Wei-Hsin et al., Low-cost pH, temperature and ion concentration sensors utilizing laser machined touch panel film.

(Continued)

*Primary Examiner* — Walter L Lindsay, Jr.
*Assistant Examiner* — Milton Gonzalez
(74) *Attorney, Agent, or Firm* — Mark M. Friedman (57) ABSTRACT

A solution property sensor is provided and has: a substrate, a temperature sensing element, an electrical conductivity sensing element, a pH value sensing element, and a reference electrode. The solution property sensor utilizes different sensing elements to sense various solution properties, and all of these sensing elements can be electrically connected and fixed to conductive patterns on the same substrate, thereby facilitating mass production in the industry or reducing production difficulty.

10 Claims, 4 Drawing Sheets

(56) References Cited

U.S. PATENT DOCUMENTS

| | | | | |
|---|---|---|---|---|
| 5,483,164 | A * | 1/1996 | Moss | G01N 27/27 |
| | | | | 204/406 |
| 7,348,783 | B1 * | 3/2008 | Hsiung | G01N 27/4167 |
| | | | | 324/438 |
| 8,742,470 | B2 * | 6/2014 | Merz | G01N 27/4167 |
| | | | | 257/253 |
| 8,864,968 | B2 * | 10/2014 | Merz | G01N 27/333 |
| | | | | 204/414 |
| 2011/0278168 | A1 | 11/2011 | Zhuiykov et al. | |
| 2014/0374251 | A1 | 12/2014 | Soccol et al. | |
| 2016/0209346 | A1 | 7/2016 | Brondum et al. | |
| 2018/0003668 | A1 * | 1/2018 | Li | G01N 33/1886 |

FOREIGN PATENT DOCUMENTS

| | | |
|---|---|---|
| TW | 201819899 A | 3/2018 |
| TW | 201819899 A | 6/2018 |

OTHER PUBLICATIONS

Martinez-Manez R et al., A multisensor in thick-film technology for water quality control.

Shah, Sahil et al., Biosensing platform on a flexible substrate, sensors and Actuators, 2015,vol.B210, p. 197-203.

John K. Atkinson et al., "A novel thick-film scree printed electrical conductivity sensor for measurement of liquid and soil conductivity", Sensors 2014 IEEE.

* cited by examiner

SOLUTION PROPERTY SENSOR

FIELD OF DISCLOSURE

The present disclosure relates to a sensor, and more particularly to a solution property sensor.

BACKGROUND OF DISCLOSURE

In monitoring properties of solutions, pH value, temperature, and electrical conductivity are important parameters. In general, measurement of pH value of water quality mostly uses an acid-base test paper, an acid-base indicator, or a glass electrode. The glass electrode mainly uses an ion-selective glass film as a sensor, and has a high selectivity for an ion or a type of ions. A front end of the electrode is a glass tube with a hollow hemispherical film wall. The film wall has a highly selectivity for hydrogen ions. An electrolyte is added to the glass tube and a reference electrode Ag/AgCl is contained in the electrolyte. By measuring a potential change, the pH value of the tested solution is obtained. In addition, in the temperature section, a glass thermometer or an infrared thermometer is mostly used. Further, the electrical conductivity can be measured using a glass electrode, and an electrical conductivity value is mainly measured by measuring resistance of the aqueous solution.

However, in the above common water quality measurement techniques, the glass electrode often has disadvantages that the sensing end is susceptible to acid and alkali, the response time is slow, the electrode maintenance is time-consuming, or the sensing end needs to immerse in a liquid when not used. Furthermore, corrections must be performed before using the glass electrode, including zero calibration of the neutral buffer solution (pH 7), sensitivity correction of pH value (pH 4 and pH 10), and temperature correction. Therefore, the glass electrode has many limitations in its use, and it is also not conducive to real-time measurement and monitoring of various water quality in response to the site environments.

Based on the above problem, the Applicant of the present application provided a solution property sensor (Taiwan Patent No. 1616655), which utilizes a single material to measure various characteristics of a solution. On a same material substrate, a plurality of sensing patterns are designed to simultaneously detect a pH value, temperature, and an electrical conductivity of a solution, to improve convenience and accuracy of measurement. However, when the above-mentioned technology is implemented in commercial applications, the solution property sensor has problems such as high manufacturing cost, complicated manufacturing process, poor package stability, and difficulty in maintaining waterproof characteristics for long-term use. In addition, the solution property sensor described above requires a laser engraving step to process a surface of an indium tin oxide (ITO) film, so as to produce a pH value sensing pattern, a temperature sensing pattern, and an electrical conductivity sensing pattern. Therefore, the process is complicated, and it is also necessary to consider the production yield and the connection characteristics of the measuring device. Furthermore, since material of the indium tin oxide film is not pure metal, the electrical connection capability is not as good as the metal connection point, so the electrical treatment at the connection end is a problem upon packaging.

As a result, it is necessary to provide a solution property sensor to solve the problems existing in the conventional technologies, as described above.

SUMMARY OF DISCLOSURE

An object of the present disclosure is to provide a solution property sensor, which is to dispose a temperature sensing element, an electrical conductivity sensing element, and a pH value sensing element on a same substrate, and these sensing elements are electrically connected to conductive patterns on the substrate. Therefore, sensing signals simultaneously detected by the temperature sensing element, the electrical conductivity sensing element and the pH value sensing element can be transmitted to the outside through these conductive patterns, so as to facilitate analysis of the solution properties. In addition, since the sensing elements are different sensing elements, it is easy to electrically connect with the conductive patterns on the substrate.

Another object of the present disclosure is to provide a solution property sensor, which uses different sensing elements to sense various solution properties, and these sensing elements can be electrically connected and fixed to conductive patterns on the substrate, thereby facilitating mass production in the industry or reducing production difficulty.

To achieve the above object, the present disclosure provides a solution property sensor which comprises a substrate, a temperature sensing element, an electrical conductivity sensing element, a pH value sensing element, and a reference electrode. The substrate has a front surface and a back surface, and defines a temperature sensing region, an electrical conductivity sensing region, a pH value sensing region, and an electrical signal output region. The substrate includes a plurality of conductive patterns and a plurality of electrical connection pins. The conductive patterns are disposed on the front surface or the back surface of the substrate, wherein the conductive patterns are electrically isolated with each other and include two temperature conductive wires, at least two electrical conductivity conductive wires, a pH value conductive wire, and a reference electrode conductive wire. The electrical connection pins are disposed on the electrical signal output region and electrically connected to the conductive patterns, respectively. The temperature sensing element is disposed on the temperature sensing region and is electrically connected to the two temperature conductive wires. The electrical conductivity sensing element is disposed on the electrical conductivity sensing region and is electrically connected to the at least two electrical conductivity conductive wires. The pH value sensing element is disposed on the pH value sensing region and is electrically connected to the pH value conductive wire, wherein a material of the pH value sensing element includes indium tin oxide, and the pH value sensing element has a sensing surface. The reference electrode is disposed on the substrate and is electrically connected to the reference electrode conductive wire.

In one embodiment of the present disclosure, the solution property sensor further comprises a waterproof layer covering at least one of the temperature sensing region and the electrical signal output region.

In one embodiment of the present disclosure, the electrical conductivity sensing element is an exposed portion of each of the at least two electrical conductivity conductive wires, wherein each of the exposed portions expose to a surface of the electrical conductivity sensing region.

In one embodiment of the present disclosure, the exposed portion is circular or square.

In one embodiment of the present disclosure, when the exposed portion is circular, a diameter of the exposed portion ranges from 0.2 mm to 1.0 mm; or when the exposed portion is square, a length and a width of the exposed portion range from 0.2 mm to 1.0 mm, respectively.

In one embodiment of the present disclosure, the conductive patterns further comprise a pH value conductive pattern electrically connected to the pH value conductive wire and disposed on the front surface or the back surface of the substrate, wherein the pH value sensing element is electrically connected to the pH value conductive pattern.

In one embodiment of the present disclosure, the pH value conductive pattern is disposed on the back surface of the substrate, and the substrate comprises a hole passing through the pH value sensing region, wherein the pH value sensing element exposes the sensing surface through the hole.

In one embodiment of the present disclosure, the solution property sensor further comprises a conductive adhesive material adhered to and electrically connected between the pH value conductive pattern and a portion of the sensing surface of the pH value sensing element.

In one embodiment of the present disclosure, the substrate is a printed circuit board or a flexible circuit board.

In one embodiment of the present disclosure, the temperature sensing region and the electrical signal output region are respectively defined on two opposite sides of the substrate.

DETAILED DESCRIPTION OF PREFERRED EMBODIMENTS

The structure and the technical means adopted by the present disclosure to achieve the above and other objects can be best understood by referring to the following detailed description of the preferred embodiments and the accompanying drawings. Furthermore, directional terms described by the present disclosure, such as upper, lower, front, back, left, right, inner, outer, side, longitudinal/vertical, transverse/horizontal, and etc., are only directions by referring to the accompanying drawings, and thus the used directional terms are used to describe and understand the present disclosure, but the present disclosure is not limited thereto.

Figure 2A:
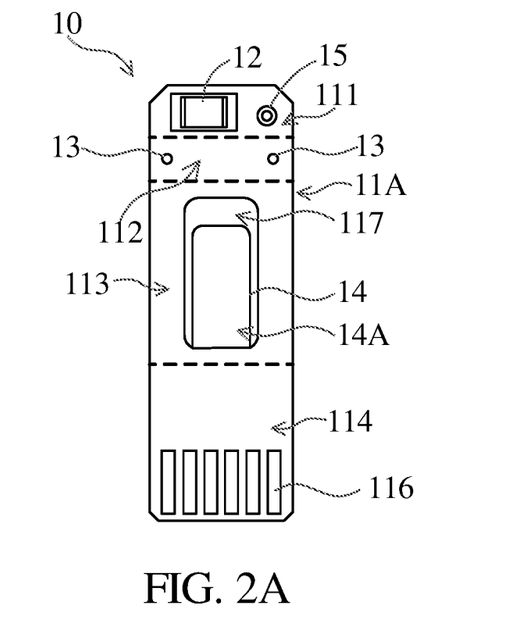
FIG. 2A shows a top view of a solution property sensor according to another embodiment of the present disclosure.
Figure 2B:
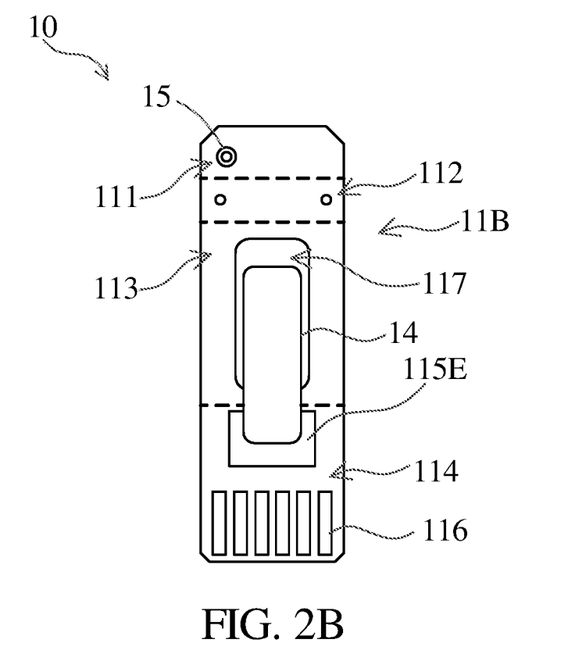
FIG. 2B shows a bottom view of a solution property sensor according to another embodiment of the present disclosure.
Figure 3A:
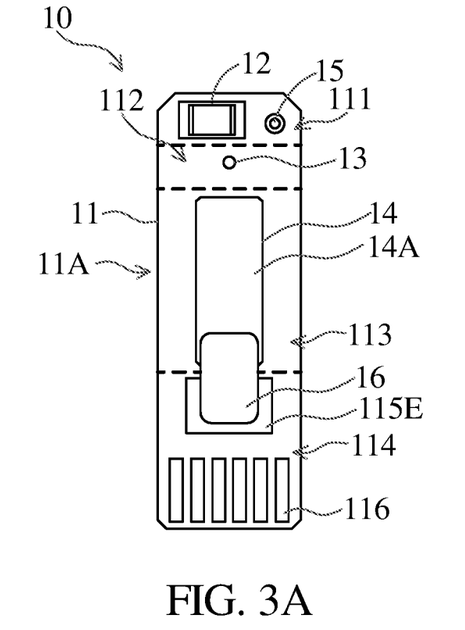
FIG. 3A shows a top view of a solution property sensor according to yet another embodiment of the present disclosure.
Figure 3B:
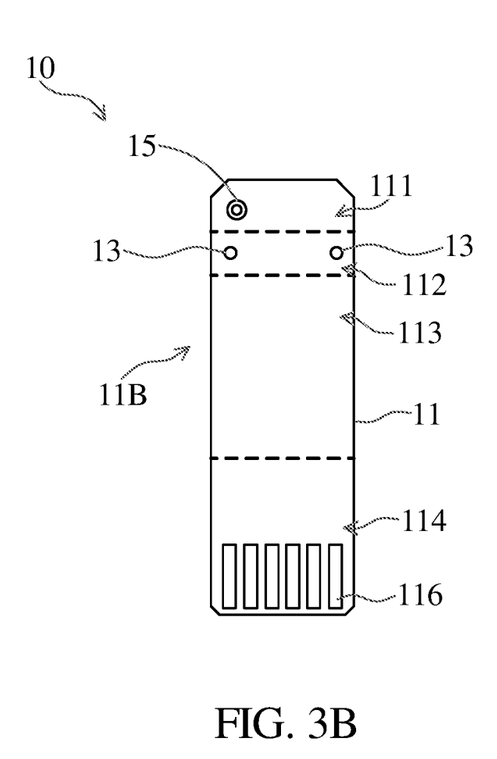
FIG. 3B shows a bottom view of a solution property sensor according to yet another embodiment of the present disclosure.
Figure 4A:
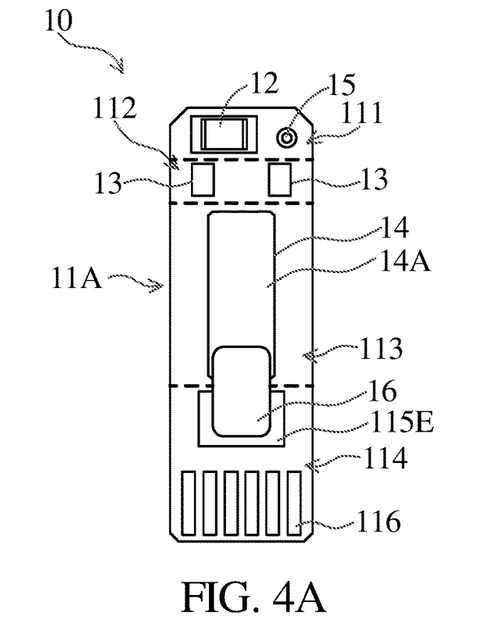
FIG. 4A shows a top view of a solution property sensor according to still another embodiment of the present disclosure.
Figure 4B:
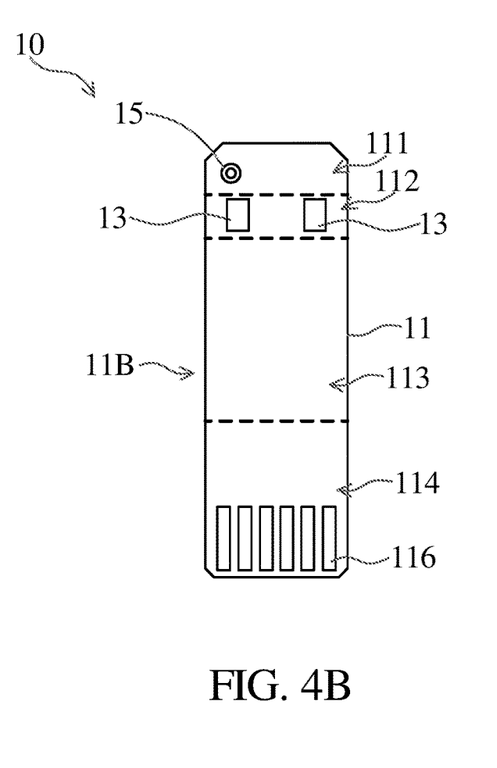
FIG. 4B shows a bottom view of a solution property sensor according to still another embodiment of the present disclosure.

Referring to FIGS. 1A to 4B, FIG. 1A shows a top view of a solution property sensor 10 according to an embodiment of the present disclosure; FIG. 1B shows a bottom view of a solution property sensor 10 according to an embodiment of the present disclosure; FIG. 2A shows a top view of a solution property sensor 10 according to another embodiment of the present disclosure; FIG. 2B shows a bottom view of a solution property sensor 10 according to another embodiment of the present disclosure; FIG. 3A shows a top view of a solution property sensor 10 according to yet another embodiment of the present disclosure; FIG. 3B shows a bottom view of a solution property sensor 10 according to yet another embodiment of the present disclosure; FIG. 4A shows a top view of a solution property sensor 10 according to still another embodiment of the present disclosure; and FIG. 4B shows a bottom view of a solution property sensor 10 according to still another embodiment of the present disclosure. It is to be noted that in order to make the drawings simpler, majority of the conductive patterns are not shown in FIGS. 2A to 4B. In one embodiment of the present disclosure, the solution property sensor 10 includes a substrate 11, a temperature sensing element 12, an electrical conductivity sensing element 13, a pH value sensing element 14, and a reference electrode 15.

The substrate 11 has, for example, a flat shape and has a front surface 11A and a back surface 11B. The substrate 11 defines a temperature sensing region 111, an electrical conductivity sensing region 112, a pH sensing region 113, and an electrical signal output region 114. In one embodiment, the temperature sensing region 111 and the electrical signal output region 114 are respectively defined on two opposite sides of the substrate 11 (such as on both sides of a head end and a tail end). In another embodiment, the positions of the temperature sensing region 111, the electrical conductivity sensing region 112, the pH sensing region 113, and the electrical signal output region 114 can be arranged according to needs of a user. For example, the temperature sensing region 111, the electrical conductivity sensing region 112, the pH sensing region 113, and the electrical signal output region 114 are sequentially arranged from the head end to the tail end of the substrate 11. Or, the electrical conductivity sensing region 112, the electrical signal output region 114, the pH sensing region 113, and the temperature sensing region 111 are sequentially arranged from the head end to the tail end of the substrate 11.

The substrate 11 includes a plurality of conductive patterns 115 and a plurality of electrical connection pins 116. The conductive patterns 115 are disposed on the front surface 11A or the back surface 11B of the substrate 11, wherein the conductive patterns 115 are electrically isolated with each other and include two temperature conductive wires 115A, at least two electrical conductivity conductive wires 115B, a pH value conductive wire 115C, and a reference electrode conductive wire 115D. In addition, the electrical connection pins 116 are disposed on the electrical signal output region 114 and are electrically connected to the conductive patterns 115, respectively.

It is noted that the substrate 11 is mainly used to bear the temperature sensing element 12, the electrical conductivity sensing element 13, the pH value sensing element 14, and the reference electrode 15. In addition, the conductive patterns 115 of the substrate 11 are mainly used for electrically connecting the above sensing elements and the reference electrode 15. The electrical connection pins 116 can be electrically connected to an external signal extraction component so as to transmit signals and voltages sensed by the above sensing elements and the reference electrode 15 to an external analytical instrument for analysis. In a specific example, the electrical connection pins 116 are also commonly referred to as "golden fingers."

It is noted that, the conductive patterns 115 of the substrate 11 are for example, metal wires (such as copper wires) formed on the substrate 11. In one embodiment, the substrate 11 can be a printed circuit board or a flexible circuit board. In a specific example, positions of the temperature sensing region 111, the electrical conductivity sensing region 112, the pH sensing region 113, and the electrical signal output region 114 can be arranged according to needs of a user, and the positions of these regions are corresponding to the conductive patterns 115, such that the sensing elements disposed on the respective sensing regions are electrically connected to the conductive patterns 115 (for example, using soldering materials, electrical connecting materials, etc.).

In one embodiment of the solution property sensor 10, the temperature sensing element 12 is disposed on the temperature sensing region 111 and is electrically connected to the two temperature conductive wires 115A. The temperature sensing element 12 is mainly used to sense temperature of a solution to be tested. In one embodiment, the temperature sensing element 12 can be a commercially available temperature resistor. It is to be noted that the temperature sensing element 12 can be any commercially available electronic component that can be disposed on the temperature sensing region 111 and that can sense temperature.

In one embodiment of the solution property sensor 10, the electrical conductivity sensing element 13 is disposed on the electrical conductivity sensing region 112 and electrically connected to the at least two electrical conductivity conductive wires 115B. The electrical conductivity sensing element 13 is mainly used to sense electrical conductivity of a solution to be tested. In one embodiment, the electrical conductivity sensing element 13 is an exposed portion of each of the at least two electrical conductivity conductive wires 115B, wherein each of the exposed portions expose to a surface of the electrical conductivity sensing region 112.

Specifically, the electrical conductivity of the solution measured through the exposed portion can be obtained by measuring an electrical conductivity of an electrical conductivity of the solution along a distance between the exposed portions of the at least two electrically conductive wires 115B, or by measuring an electrical conductivity of an electrical conductivity of the solution inside in an area or volume surrounded by the exposed portions of the three or more electrically conductive wires 115B. Therefore, the more accurately the measured conductance will be when there is more volume surrounded by the exposed portions. In one embodiment, the electrical conductivity sensing element 13 has two or three portions (as shown in FIGS. 3A and 3B), four portions (as shown in FIGS. 4A and 4B), or more than five exposed portions. In another embodiment, the exposed portion is circular (as shown in FIGS. 1A to 3B) or square (as shown in FIGS. 4A and 4B). When the exposed portion is circular, a diameter of the exposed portion ranges from 0.2 mm to 1.0 mm; or when the exposed portion is square, a length and a width of the exposed portion range from 0.2 mm to 1.0 mm, respectively. It is noted that when the size of the exposed portion is too small or too large (for example, a diameter, a length or a width is less than 0.2 mm, or greater than 1.0 mm), accurate electrical conductivity can not be measured.

In one embodiment of the solution property sensor 10, the pH value sensing element 14 is disposed on the pH value sensing region 113 and is electrically connected to the pH value conductive wire 115C, wherein a material of the pH value sensing element 115 includes indium tin oxide. In one embodiment, the pH value sensing element 14 is, for example, a commercially available indium tin oxide (ITO) substrate. Further, the pH value sensing element 14 has a sensing surface 14A. The sensing surface 14A is mainly used to sense the pH value of the solution to be tested.

In one embodiment, the conductive patterns 115 further comprises a pH value conductive pattern 115E electrically connected to the pH value conductive wire 115C and disposed on the front surface 11A or the back surface 11B of the substrate 11, wherein the pH value sensing element 14 is electrically connected to the pH value conductive pattern 115E. In one embodiment, a size of the pH value conductive pattern 115E is, for example, 10% to 50% of the pH value sensing element 14, such as 15%, 20%, 30%, 35%, 40%, or 45%. In a specific example, for example, the pH value sensing element 14 is a rectangular plate member, wherein a width of the pH value conductive pattern 115E is substantially the same or approximate to a width of the rectangular plate member, but a length of the pH value conductive pattern 115E is about 10% to 50% of a length of the rectangular plate. At least one advantage of the above embodiments is that the pH value sensing element 14 does not need to undergo a specific patterning process and can be cut into a rectangular shape by a simple cutting method. In addition, since the size of the pH value conductive pattern 115E is not too small relative to a size of the pH-sensing element 14, the manufacturing process can be simplified in a large number of fabrications. Further, the manufacturing process of the embodiment is easier than a technique disclosed in Taiwan Patent No. 1616655.

Figure 1A:
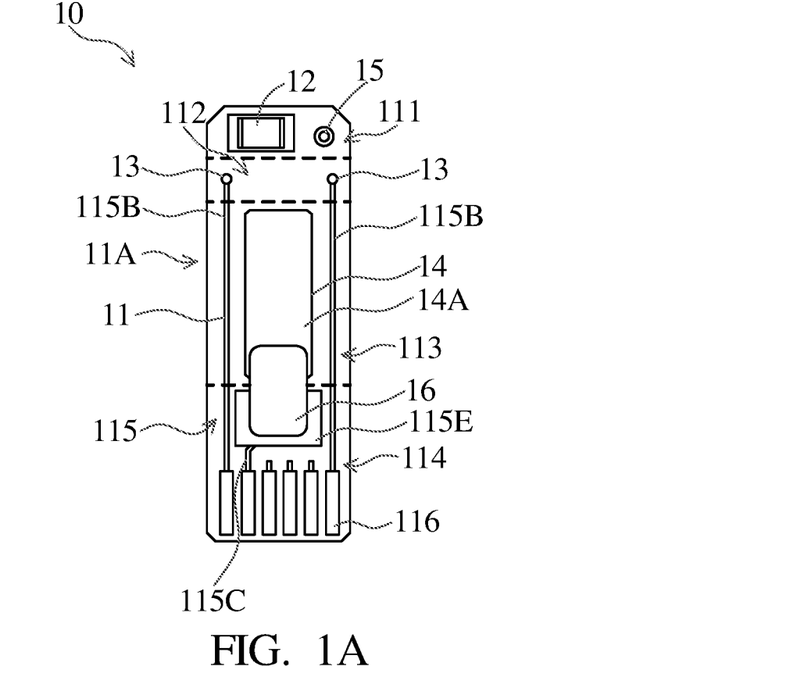
FIG. 1A shows a top view of a solution property sensor according to an embodiment of the present disclosure.
Figure 1B:
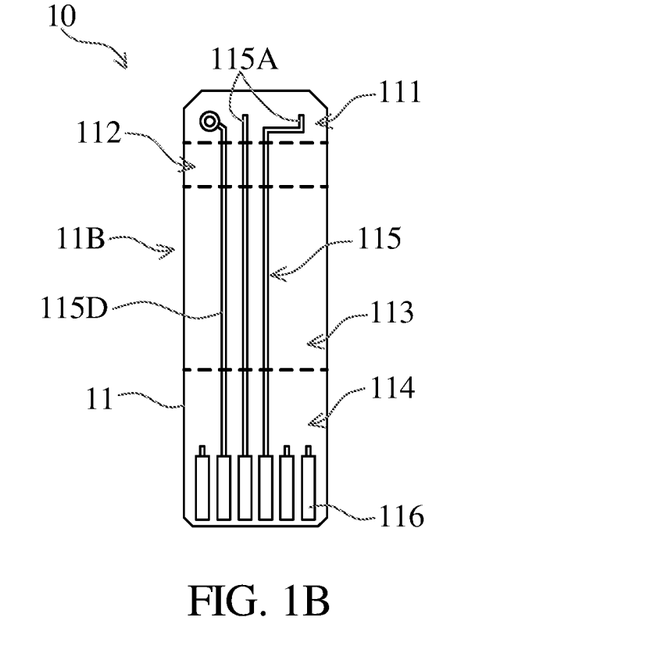
FIG. 1B shows a bottom view of a solution property sensor according to an embodiment of the present disclosure.

In one embodiment, as shown in FIGS. 1A and 1B, the pH value conductive pattern 115E is disposed on the front surface 11A of the substrate 11 (for example, disposed on the electrical signal output region 114). Further, a conductive adhesive material 16 (such as a commercially available conductive adhesive) can be fixedly adhered to and electrically connected between the pH value conductive pattern 115E and a portion of the sensing surface 14A of the pH value sensing element 14.

In an embodiment, as shown in FIGS. 2A and 2B, the pH signal conductive pattern 115E is disposed on the back surface 11B of the substrate 11 (for example, disposed in the electrical signal output region 114), and the substrate further includes a hole 117 passing through the pH value sensing region 113, wherein the pH value sensing element 14 exposes the sensing surface 14A through the hole 117. In one example, a conductive adhesive material (such as a commercially available conductive adhesive; not shown) can be fixedly adhered to and electrically connected between the pH value conductive pattern 115E and a portion of the sensing surface 14A of the pH value sensing element 14.

It is noted that, either the embodiment that the pH value conductive pattern 115E is disposed on the front surface 11A of the substrate 11, or the embodiment that the pH value conductive pattern 115E is disposed on the back surface 11B of the substrate 11, has different advantages. In the case where the pH-based conductive pattern 115E is disposed on the front surface 11A of the substrate 11 (as shown in FIGS. 1A and 1B), since only a conductive adhesive material 16 needs to be adhered onto the pH value conductive pattern 115E and onto the sensing surface 14A of pH value sensing element 14. Therefore, the process is simple. However, since the pH value conductive pattern 115E and the sensing surface 14A face in the same direction in this case, the conductive adhesive material 16 needs to be bridged to produce a adhering effect, which is disadvantageous to miniaturization of the solution property sensor in the embodiment of the present disclosure.

On the other hand, when the pH-based conductive pattern 115E is disposed on the back surface 11B of the substrate 11 (as shown in FIGS. 2A and 2B), it is necessary to form the hole 117 in the pH value sensing region 113. Therefore, the fabrication steps are complicated. The conductive adhesive material can be sandwiched between the pH value conductive pattern 115E and the sensing surface 14A. The miniaturization of the solution property sensor 10 of the embodiment of the present disclosure is improved.

In one embodiment of the solution property sensor 10, the reference electrode 15 is disposed on the substrate 11 and is electrically connected to the reference electrode conductive wire 115D. The reference electrode 15 is mainly used to measure a reference value or a standard value of a voltage measured by other sensing elements. In one embodiment, the reference electrode 15 can be disposed on the temperature sensing region 111. In another embodiment, the reference electrode 15 can be disposed on the electrical conductivity sensing region 112, the pH value sensing region 113, or the electrical signal output region 114 based on user requirements or the disposing of the reference electrode conductive wire 115D.

In one embodiment, the solution property sensor 10 of the embodiment of the present disclosure can include a waterproof layer (not shown) based on characteristics of the respective sensing elements. For example, the temperature sensing element 12 or the electrical connection pins 116 can be covered by the waterproof layer to prevent from a short circuit of the electrical signal due to the solution directly contacting the temperature sensing component 12 or the electrical connection pins 116. In other words, the waterproof layer covers at least one of the temperature sensing region 111 and the electrical signal output region 114. It is noted that, an area where the waterproof treatment is required may be disposed on both sides of the head and the tail of the substrate 11, or at the edge of the substrate 11. The disposing method has the advantages that, for example, in the case that the area where the waterproof treatment is required is disposed on both sides of the head and the tail of the substrate 11, the substrate 11 can be directly clamped, and the front and back sides of the substrate 11 are respectively immersed in the waterproof glue. Then, disposing of the waterproof layer can be completed. Therefore, this disposing is beneficial to industrial quantitative production.

As described above, an embodiment of the present disclosure is to provide a solution property sensor, which is to dispose a temperature sensing element, an electrical conductivity sensing element, and a pH value sensing element on a same substrate, and these sensing elements are electrically connected to conductive patterns on the substrate. Therefore, sensing signals simultaneously detected by the temperature sensing element, the electrical conductivity sensing element and the pH value sensing element can be transmitted to the outside through these conductive patterns, so as to facilitate analysis of the solution properties. In addition, since the sensing elements are different sensing elements, it is easy to electrically connect with the conductive patterns on the substrate.

The present disclosure has been described with a preferred embodiment thereof and it is understood that many changes and modifications to the described embodiment can be carried out without departing from the scope and the spirit of the disclosure that is intended to be limited only by the appended claims.

The invention claimed is:

1. A solution property sensor, comprising:
a substrate having a front surface and a back surface, wherein the substrate defines a temperature sensing region, an electrical conductivity sensing region, a pH value sensing region, and an electrical signal output region, wherein the substrate includes:
a plurality of conductive patterns disposed on the front surface or the back surface of the substrate, wherein the conductive patterns are electrically isolated with each other and include two temperature conductive wires, at least two electrical conductivity conductive wires, a pH value conductive wire, and a reference electrode conductive wire, wherein the conductive patterns further comprises a pH value conductive pattern electrically connected to the pH value conductive wire and disposed on the front surface or the back surface of the substrate; and
a plurality of electrical connection pins disposed on the electrical signal output region and electrically connected to the conductive patterns, respectively;
a temperature sensing element disposed on the temperature sensing region and electrically connected to the two temperature conductive wires;
an electrical conductivity sensing element disposed on the electrical conductivity sensing region and electrically connected to the at least two electrical conductivity conductive wires;
a pH value sensing element disposed on the pH value sensing region and electrically connected to the pH value conductive wire, wherein a material of the pH value sensing element includes indium tin oxide, and the pH value sensing element has a sensing surface formed of indium tin oxide and configured to sense a pH value of a solution, wherein the pH value sensing element is a rectangular plate member, wherein the pH value sensing element is electrically connected to the pH value conductive pattern, wherein a width of the pH value conductive pattern is substantially a width of the rectangular plate member, and a length of the pH value conductive pattern is 10% to 50% of a length of the rectangular plate; and
a reference electrode disposed on the substrate and electrically connected to the reference electrode conductive wire.

2. The solution property sensor according to claim 1, further comprising a waterproof layer covering at least one of the temperature sensing region and the electrical signal output region.

3. The solution property sensor according to claim 1, wherein the electrical conductivity sensing element is an exposed portion of each of the at least two electrical conductivity conductive wires, wherein each of the exposed portions is exposed to a surface of the electrical conductivity sensing region.

4. The solution property sensor according to claim 3, wherein the exposed portion is circular or square.

5. The solution property sensor according to claim 4, wherein:
when the exposed portion is circular, a diameter of the exposed portion ranges from 0.2 mm to 1.0 mm; or
when the exposed portion is square, a length and a width of the exposed portion range from 0.2 mm to 1.0 mm, respectively.

6. The solution property sensor according to claim 1, wherein the pH value conductive pattern is disposed on the back surface of the substrate, and the substrate comprises a hole passing through the pH value sensing region, wherein the pH value sensing element exposes the sensing surface through the hole.

7. The solution property sensor according to claim 6, further comprising a conductive adhesive material adhered to and electrically connected between the pH value conductive pattern and a portion of the sensing surface of the pH value sensing element.

8. The solution property sensor according to claim 1, further comprising a conductive adhesive material adhered to and electrically connected between the pH value conductive pattern and a portion of the sensing surface of the pH value sensing element.

9. The solution property sensor according to claim 1, wherein the substrate is a printed circuit board or a flexible circuit board.

10. The solution property sensor according to claim 1, wherein the temperature sensing region and the electrical signal output region are respectively defined on two opposite sides of the substrate.

* * * * *